US010614870B2

(12) United States Patent
Ho et al.

(10) Patent No.: US 10,614,870 B2
(45) Date of Patent: Apr. 7, 2020

(54) LOW POWER METHOD AND SYSTEM FOR SIGNAL SLEW RATE CONTROL

(71) Applicant: Micron Technology, Inc., Boise, ID (US)

(72) Inventors: Michael V. Ho, Allen, TX (US); Scott E. Smith, Plano, TX (US)

(73) Assignee: Micron Technology, Inc., Boise, ID (US)

(*) Notice: Subject to any disclaimer, the term of this patent is extended or adjusted under 35 U.S.C. 154(b) by 57 days.

(21) Appl. No.: 15/976,739

(22) Filed: May 10, 2018

(65) Prior Publication Data
US 2019/0348104 A1    Nov. 14, 2019

(51) Int. Cl.
*G11C 11/4076* (2006.01)
*G11C 11/4093* (2006.01)
*G11C 11/408* (2006.01)

(52) U.S. Cl.
CPC ...... *G11C 11/4076* (2013.01); *G11C 11/4085* (2013.01); *G11C 11/4093* (2013.01); *G11C 11/4087* (2013.01)

(58) Field of Classification Search
CPC ............ G11C 11/4076; G11C 11/4085; G11C 11/4093; G11C 11/4087
USPC .......................................................... 465/149
See application file for complete search history.

(56) References Cited

U.S. PATENT DOCUMENTS

| 6,559,676 B1* | 5/2003 | Tomita ................. H03K 17/166 326/26 |
| 2006/0097764 A1* | 5/2006 | Yeh .......................... H03K 5/12 327/170 |
| 2007/0103209 A1* | 5/2007 | Lee ....................... G11C 7/1051 327/112 |

* cited by examiner

*Primary Examiner* — Anthan Tran
(74) *Attorney, Agent, or Firm* — Perkins Coie LLP

(57) ABSTRACT

An electronic device includes a first circuit grouping including a first set of drivers, the first circuit grouping configured to generate a first set of output signals corresponding to a first slew rate; and s second circuit grouping including a second set of drivers, the second circuit grouping configured to generate a second set of output signals corresponding to a second slew rate, wherein the first set of drivers correspond to one or more physical characteristics different than the second set of drivers for introducing different slew rates.

20 Claims, 6 Drawing Sheets

LOW POWER METHOD AND SYSTEM FOR SIGNAL SLEW RATE CONTROL

TECHNICAL FIELD

The disclosed embodiments relate to electronic devices, and, in particular, to electronic devices with a method and system for low power signal slew rate control.

BACKGROUND

Electronic devices systems (e.g., semiconductor devices) can utilize and generate various timing signals in performing a variety of different functions/features. In some embodiments, the electronic devices can employ memory devices to store and access information. The memory devices can include volatile memory devices, non-volatile memory devices, or a combination device. Memory devices, such as dynamic random-access memory (DRAM), can utilize electrical energy to store and access data. For example, the memory devices can include Double Data Rate (DDR) RAM devices that implement DDR interfacing scheme for high-speed data transfer. However, existing schemes for generating/utilizing the timing signals can consume relatively large amounts of power.

With technological advancements in other areas and increasing applications, the market is continuously looking for faster, more efficient, and smaller devices. For example, lowering power consumption can be one of the highest motivations in the DRAM market. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to electronic devices, systems with electronic devices, and related methods for controlling the integrity (e.g., a slew rate) of output signals, such as for signals communicated from one or more memory devices to a controller or vice versa. The electronic devices (e.g., memory devices) can include staggered groups of output legs with different physical/electrical traits (e.g., component sizes, such as for drivers and/or capacitors, circuit lengths, component counts, etc.). The staggered groups of output legs can be used to generate phase differences in output signals (e.g., for a three-phase output signals).

The electronic devices can include a staggered scheme for different stages for groups of output legs. After a data signal is clocked out with a delay locked loop (DLL), the different stages can combine data with strength information (e.g., output drive strength (ODS), on die termination (ODT), read drive strength, etc.), such as for read cycle, enable/disable control, etc. The output legs can be grouped according to speed/timing. For example, a faster grouping of the output legs can be used to define/control a turn-on timing of an output driver. A medium grouping of the output legs can be used to smooth out or shape the data transition. A slower grouping of the output legs can be used to keep the correct strength information once the data signal is communicated between devices.

The various groupings of the output legs can correspond to delays used to control the slew rates in the signals output from the groupings. The slew rate can be an amount of change in the voltage over the transition time, e.g., according to a DDR specification (e.g., 4V/ns to 9V/ns). Signal slew rates that fall outside of the specified limits/ranges are undesirable as they can degrade the device's performance in a system. Conversely, controlling the slew rates based on designing/controlling physical traits of one or more components/aspects of the circuit path can provide reduced power consumption and improved performance. Instead of using staggered delays to generate the phases (i.e., such as done in some existing designs), the electronic devices can use physical traits (e.g., gate drives and capacitive loads) in stages in the data path to generate the phases. Based on eliminating the stagger delays, the electronic devices can reduce the power consumption required to generate the phases.

Figure 1:
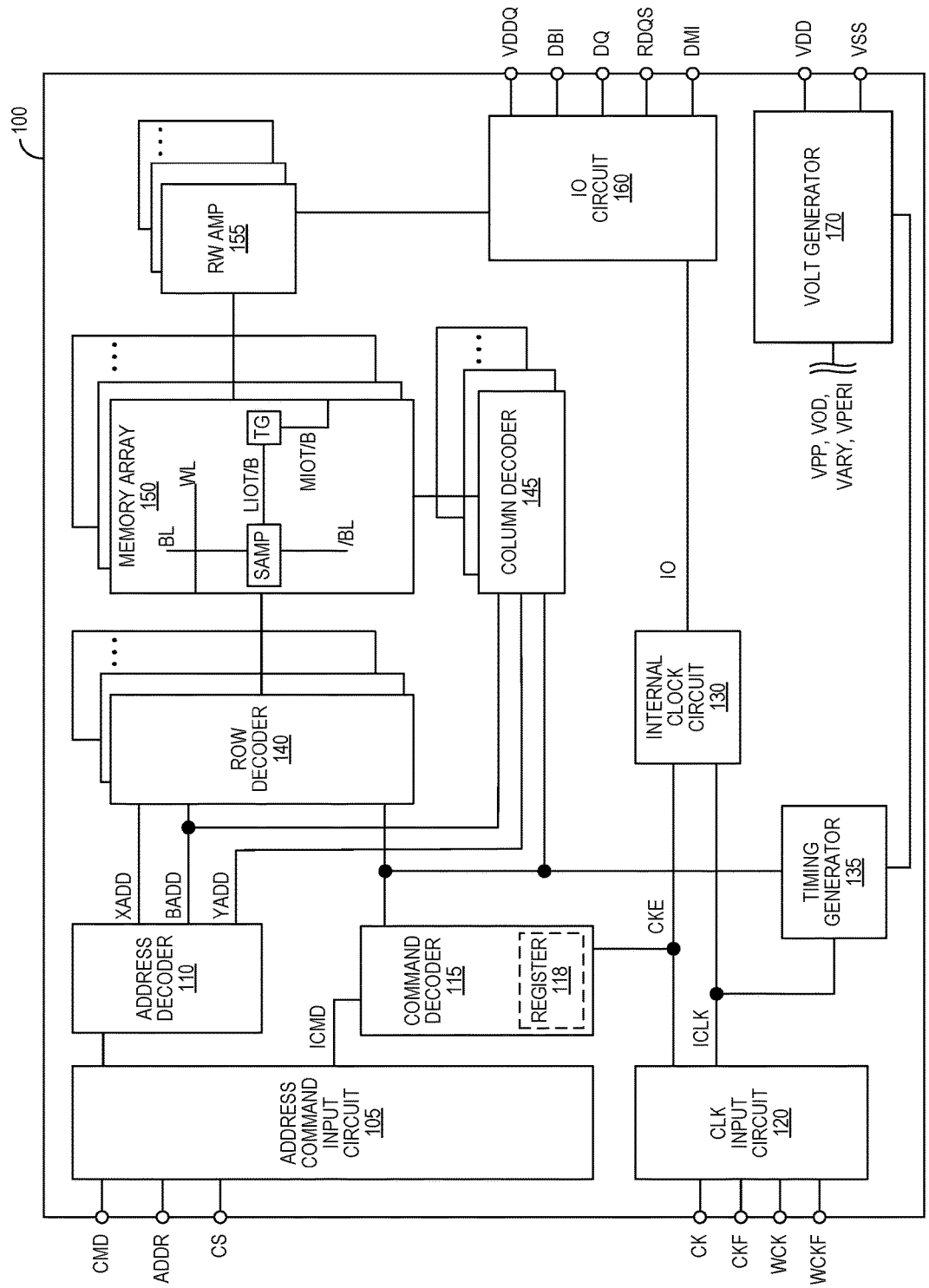
FIG. 1 is a block diagram of an electronic device in accordance with an embodiment of the present technology.

FIG. 1 is a block diagram of an electronic device (e.g., a semiconductor memory device 100, such as a DRAM device) in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 117 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The electronic device (e.g., the memory device 100 and/or the host device) can include a signal output/generator circuit (e.g., the input/output circuit 160) configured to control the integrity (e.g., a slew rate) of output signals. For example, the input/output circuit 160 can include a staggered scheme for different stages for groups of output legs. The output legs can be configured to have different output speeds/timing based on different physical/electrical traits (e.g., component sizes, such as for drivers and/or capacitors, circuit length, component count, etc.) of circuit components therein.

Figure 2:
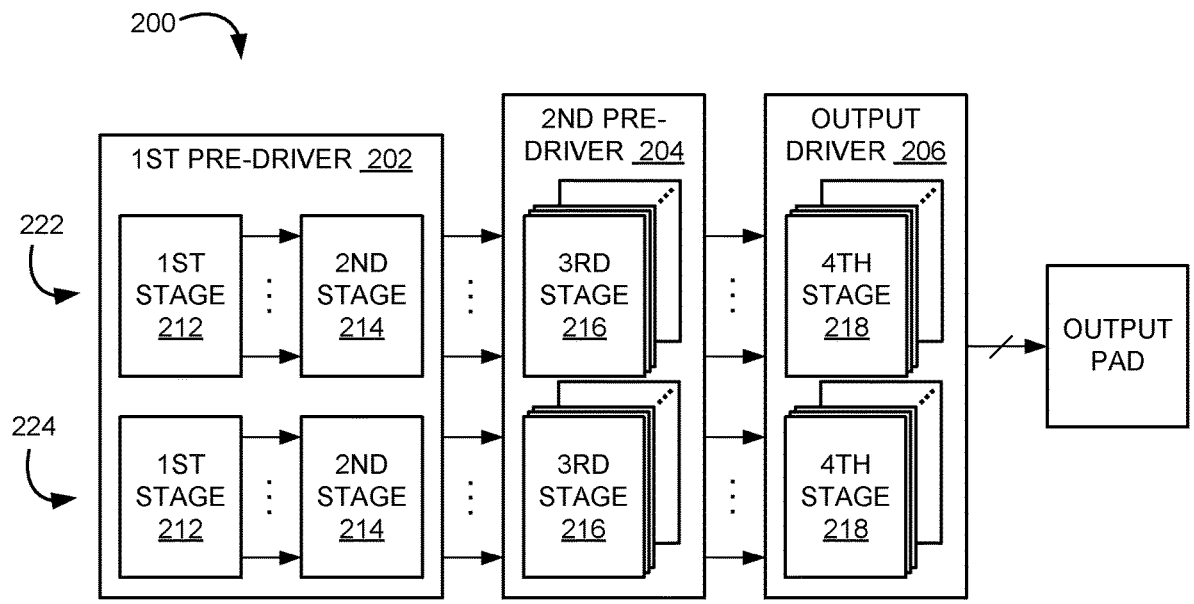
FIG. 2 illustrates a block diagram of a signal output circuit in accordance with an embodiment of the present technology.

FIG. 2 illustrates a block diagram of a signal output circuit 200 in accordance with an embodiment of the present technology. The signal output circuit 200 can include the input/output circuit 160 of FIG. 1 or a portion thereof. In some embodiments, the signal output circuit 200 can be coupled to a DLL. After the data signal is clocked out with the delay locked loop (DLL), the different stages can combine data with strength information (e.g., output drive strength (ODS), on die termination (ODT), read drive strength, etc.), such as for read cycle, enable/disable control, etc. The resulting signal can be routed to one or more output pads.

The signal output circuit 200 can include a first pre-driver 202, a second pre-driver 204, and an output driver 206, etc. each configured to control slew rates in the output signals while combining the data with strength information. The first pre-driver 202, the second pre-driver 204, the output driver 206, etc. can include multiple circuit stages (e.g., a first stage 212, a second stage 214, a third stage 216, a fourth stage 218, etc. For example, the first stage 212 can be configured to control activation of a number of circuit legs in generating the output signals. The second stage 214 (e.g., ZQ drivers) can be configured to generate the drive strength and the ODT strength for the output signals.

The third stage 216 can be configured to control a drive strength in each of the activated circuit legs. The fourth stage 218 can be configured to generate the output signals (e.g., three signals with different phase/slew rates) using the circuit legs and the drive strength as set by the first stage 212 and the third stage 216. In some embodiments, the third stage 216, the fourth stage 218, etc. can include multiple (e.g., two, three, four, five, six, seven, or more) parallel circuit modules. Each of the circuit module can be a circuit leg.

The signal output circuit 200 can introduce relatively small amounts of slew rates across the first two or three stages. The majority of the difference in the slew rate can be controlled based on the circuit path and/or physical/electrical characteristic of components in the circuit path at the third stage 216 and/or the fourth stage 218. Accordingly, the overall signal routing resulting from the first three stages can control the slew rate of the output signals. In some embodiments, the first stage 212 can include three drivers, the second stage 214 and/or the third stage 216 can include four drivers, and the fourth stage 218 can include seven legs with each leg including variable strength settings/circuits.

The signal output circuit 200 can further include multiple parallel circuit paths. For example, the signal output circuit 200 can include a first circuit path 222 and a second circuit path 224. The first circuit path 222 can be configured to process positive data input signals, and the second circuit path 224 can be configured to process negative data input signals. The first pre-driver 202, the second pre-driver 204, the output driver 206, etc. can be divided/separated/configured according to the multiple parallel circuit paths (e.g., the first circuit path 222 and the second circuit path 224).

Figure 3:
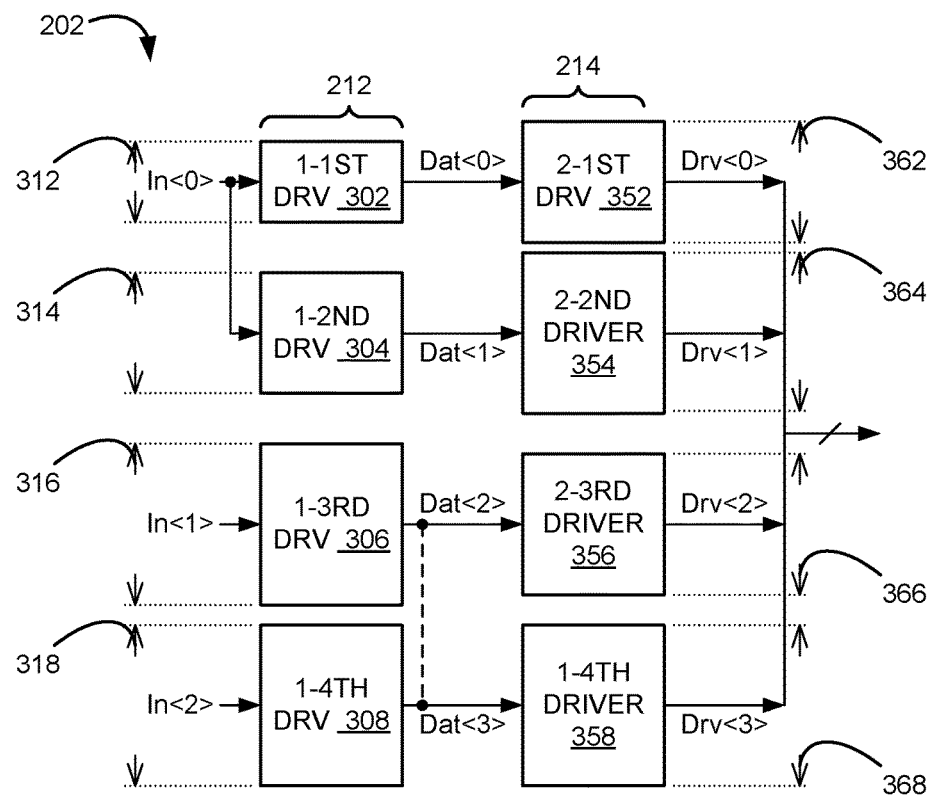
FIG. 3 illustrates a block diagram of an output circuit in accordance with an embodiment of the present technology.

FIG. 3 illustrates a block diagram of an output circuit (e.g., the first pre-driver 202) in accordance with an embodiment of the present technology. The first pre-driver 202 can include a set of multiple (e.g., four) drivers in the first stage 212 and/or the second stage 214. For example, the first stage 212 can include a first-stage first driver 302, a first-stage second driver 304, a first-stage third driver 306, a first-stage fourth driver 308, etc. Also, the second stage 214 can include a second-stage first driver 352, a second-stage second driver 354, a second-stage third driver 356, a second-stage fourth driver 358, etc.

In some embodiments, the first-stage drivers can receive a first input (In<0>), a second input (In<1>), a third input (In<3>), etc. For example, the first-stage first driver 302 and the first-stage second driver 304 can receive the first input, the third driver 306 can receive the second input, and the fourth driver 308 can receive the third input. In some embodiments, the multiple drivers in the first stage can each receive its own enable signal (e.g., Enable<0> at the first driver, Enable<1> at the second driver, etc.). Based on the input signals and the enable signals, each of the drivers can generate an output signal. For example, the first-stage first driver 302 can generate a first output (Dat<0>), the first-stage second driver 304 can generate a second output (Dat<1>), the first-stage third driver 306 can generate a third output (Dat<2>), the first-stage fourth driver 308 can generate a fourth output (Dat<3>), etc.

Each of the first-stage drivers (e.g., logic gates, such as NAND gates) can be configured to have a physical trait (e.g., a driver size, such as space/area on the silicon/die occupied by the driver) that correspond to a different slew rate. For example, the first-stage first driver 302 can correspond to a first-stage first size 312, the first-stage second driver 304 can correspond to a first-stage second size 314, the first-stage third driver 306 can correspond to a first-stage third size 316, the first-stage fourth driver 308 can correspond to a first-stage fourth size 318, etc.

The various drivers of the first stage can have different relative sizes that correspond to different slew rates. In some embodiments, the first-stage fourth size 318 (e.g., fastest slew rate) can be greater than the first-stage third size 316, the first-stage third size 316 can be greater than the first-stage second size 314, etc. with the first-stage first size 312 (e.g., slowest slew rate) being the smallest among the drivers. In some embodiments, the first-stage second size 314 can be double (e.g. 2×) the first-stage first size 312 (e.g., 1×), and the first-stage third size 316 and/or the first-stage fourth size 318 can be triple the (e.g. 3×) the first-stage first size 312. In some embodiments, the driver sizes can be controlled according to the output circuit legs (e.g., seven output legs corresponding to the third and fourth stage). The driver size for a single/base output leg (e.g., a single driver grouping that corresponds to a fast slew rate in the output) can correspond to a minimum size (e.g., the first-stage first size 312 or 1×). Two of the additional fast slew rate legs can correspond to driver sizes that are twice (e.g., 2×) the minimum size. Two of the slower slew rate legs and two of the medium slew rate legs can correspond to 1.5 times (e.g., 1.5×) the minimum driver size. The equivalent driver size for the slower/medium slew rates can be based on combining the drivers in the first stage, such as by having the third and fourth drivers connected in parallel.

The various drivers of the first stage can have different relative capacitance values (e.g., gate capacitance and/or additional capacitors) that correspond to different slew rates. The capacitance values, along with circuit resistance values, can generally have a direct relationship with time/slew rate (e.g., t=RC, where R represents the driver size). For example, smaller R (e.g., strong driver) and/or smaller C can correspond to the faster slew rates; average R and C can correspond to the medium slew rates; and greater R (e.g., weaker driver) and/or greater C can correspond to the slower slew rates.

In some embodiments, the first driver (e.g., a faster driver) can correspond to the minimum capacitance value (e.g., $1C_1$) with the other drivers (e.g., medium and slower drivers) having twice the capacitance value of the minimum. In some embodiments, the capacitor sizes can also be controlled according to the output circuit legs (e.g., seven output legs corresponding to the third and fourth stage). The capacitor size for a single/base output leg can correspond to a minimum capacitance (e.g., the first-stage first driver 302 or $1C_1$). Two of the additional fast slew rate legs can correspond to capacitances that are twice (e.g., $2C_1$) the minimum size. Two of the slower slew rate legs and two of the medium slew rate legs can correspond to quadruple (e.g., $4C_1$) the minimum capacitance.

The difference in the driver sizes can generate different slew rates for the generated outputs. For example, the first output, the second output, the third output, the fourth output, etc. can have different slew rates (e.g., the first output being the slowest and the fourth output being the fastest) according to the driver size differences. In some embodiments, the third output and the fourth output can be electrically coupled together.

The resulting outputs can be provided to the second stage 214. For example, the second-stage first driver 352 can receive the first output, the second-stage second driver 354 can receive the second output, the second-stage third driver 356 can receive the third output, the second-stage fourth driver 258 can receive the fourth output, etc. In some embodiments, the multiple drivers in the second stage can each receive its own enable signal (e.g., Enable2<0> at the first driver, Enable2<1> at the second driver, etc.). In some embodiments, the second-stage third driver 366 and the second-stage fourth driver 368 can be controlled by the same enable signal (e.g., Enable2<2>). Based on the input signals and the enable signals, each of the drivers can generate a second stage output (e.g., first pre-driver output) signal. For example, the second-stage first driver 352 can generate a first output (Drv<0>), the second-stage second driver 354 can generate a second output (Drv<1>), the second-stage third driver 356 can generate a third output (Drv<2>), the second-stage fourth driver 358 can generate a fourth output (Drv<3>), etc. Outputs of the second stage can be provided as input to the third stage.

Similar to the first stage 212, each of the second stage drivers (e.g., logic gates, such as NAND or NOR gates or inverters) can be configured to have a physical trait (e.g., a driver size) that correspond to a different slew rate. For example, the second-stage first driver 302 can correspond to a second-stage first size 362, the second-stage second driver 354 can correspond to a second-stage second size 364, the second-stage third driver 356 can correspond to a second-stage third size 366, the second-stage fourth driver 358 can correspond to a second-stage fourth size 368, etc.

The various drivers in the second stage can also have different relative sizes that correspond to different slew rates. In some embodiments, the second-stage fourth size 368 (e.g., corresponding to faster slew rate) can be same as/equal to the second-stage second size 364 (e.g., corresponding to faster slew rate). The second-stage fourth size 368 and/or the second-stage second size 364 can be double the size of the second-stage first size 362 (e.g., corresponding to slower slew rate). The second-stage third size 366 (e.g., 3Y) can be between the second-stage first size 362 (e.g., 2Y) and the second-stage fourth size 368 (e.g., 4Y) and/or the second-stage second size 364 (e.g., 4Y). In some embodiments, the second-stage first size 362 can be same as/equal to the first-stage second size 314. In some embodiments, such as for the seven output circuit legs, the driver size for a single/base output leg can correspond to a minimum size (e.g., 1Y, where X=Y in some embodiments). Two of the additional faster-rate legs and the two medium-rate legs can correspond to driver sizes that are twice (e.g., 2Y) the minimum size. Two of the slower-rate legs can correspond to 1.5 times (e.g., 1.5Y) the minimum driver size.

The various drivers of the second stage can have different relative capacitance values that correspond to different slew rates. In some embodiments, the first driver (e.g., a faster driver) can correspond to the minimum capacitance value (e.g., $1C_2$), with the medium driver having capacitance 1.5 times of the minimum and the slower driver having double the capacitance of the minimum. In some embodiments, such as for the seven output circuit legs, the capacitor size for a single/base output leg can correspond to a minimum capacitance (e.g., the first-stage first driver 302 or $1C_2$). Two of the additional fast slew rate legs can correspond to capacitances that are twice (e.g., $2C_2$) the minimum size. Two of the slower slew rate legs and two of the medium slew rate legs can correspond to 2.5 times (e.g., $2.5C_2$) the minimum capacitance. The minimum capacitance value of the second stage can be equal to or different from that of the first stage.

Figure 4:
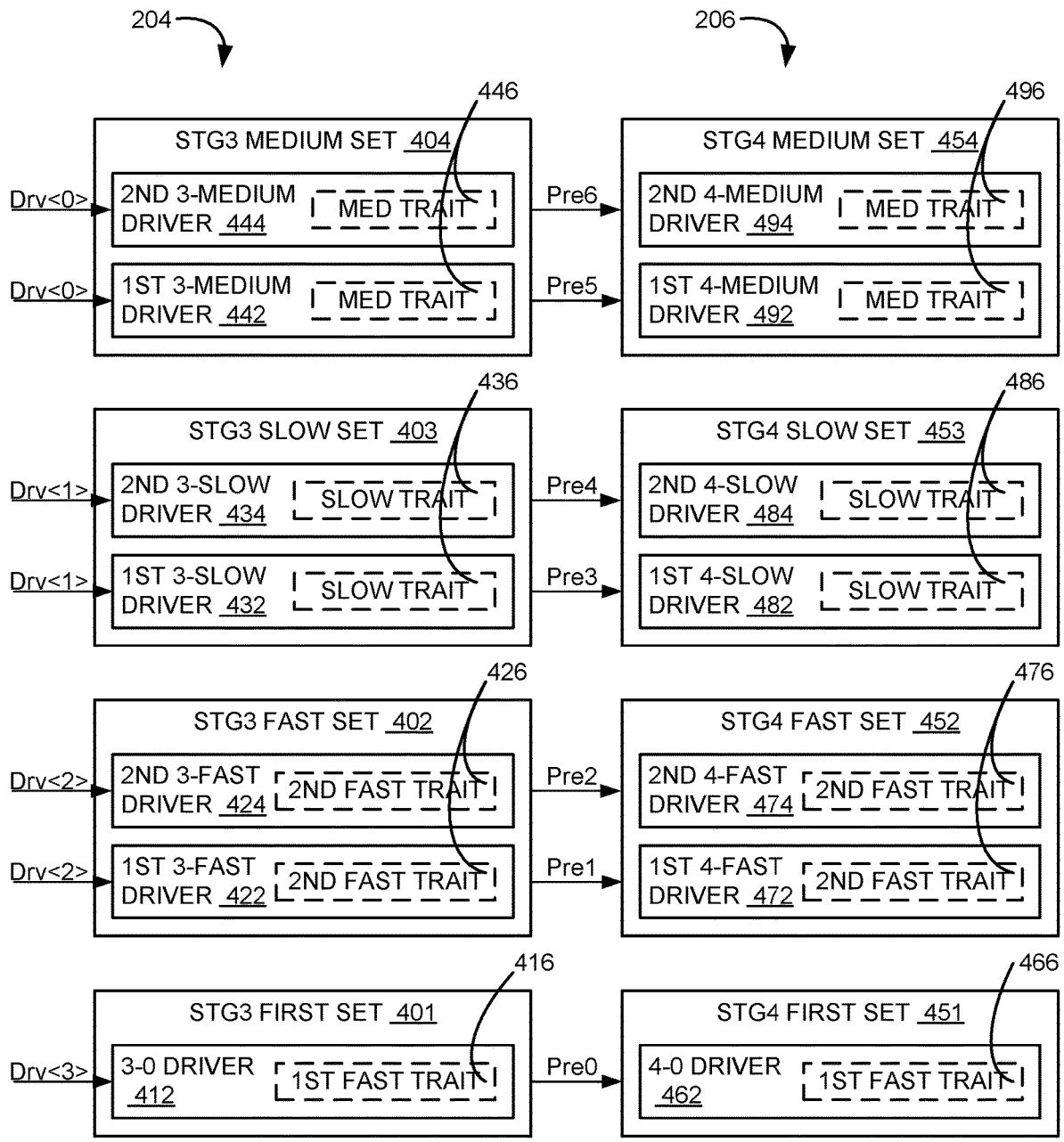
FIG. 4 illustrates a block diagram of a further output circuit in accordance with an embodiment of the present technology.

FIG. 4 illustrates a block diagram of a further output circuit (e.g., the second pre-driver 204 and/or the output driver 206) in accordance with an embodiment of the present technology. The second pre-driver 204 can include a set of multiple (e.g., two or more) circuit sets/modules, a set of drivers (e.g., two or more), etc. For example, the second pre-driver 204 can include multiple circuit sets configured for different slew rates or speeds. Also, the second pre-driver 204 can include drivers that correspond to the circuit sets.

In some embodiments, the second pre-driver 204 (e.g., the third stage circuit 216 of FIG. 2) can include three or four circuits sets for implementing three phases (e.g., three different slew rates that correspond to faster, slower, and medium rate). The second pre-driver 204 can also include seven drivers that are grouped into three sets of two driver groupings and a set of a single driver grouping. For example, the second pre-driver 204 can include a third-stage first set 401, a third-stage fast set 402, a third-stage slow set 403, and a third-stage medium set 404. The third-stage first set 401 can be the single driver set that includes a third-stage base driver group 412 (e.g., a single grouping of fastest/additional drivers used to adjust the slew speed). The remaining circuit sets can include two driver groupings each, such that the third-stage fast set 402 includes a third-stage first fast grouping 422 and a third-stage second fast grouping 424; the third-stage slow set 403 includes a third-stage first slow grouping 432 and a third-stage second slow grouping 434; and the third-stage medium set 404 includes a third-stage first medium grouping 442 and a third-stage second medium grouping 444.

The drivers in the third stage can include one or more drivers and/or capacitors that each have a physical trait (e.g., a driver/gate size, such as space/area on the silicon/die occupied by the driver, a capacitance value, such as for gate capacitance or additional capacitor structures, gate loading, etc.) that correspond to a different slew rate. For example, the third-stage initial driver 412 can correspond to an initial driver physical profile 416. Also, the third-stage first fast grouping 422 and/or the third-stage second fast grouping 424 can correspond a fast driver physical profile 426, the third-stage first slow grouping 432 and/or the third-stage second slow grouping 434 can correspond to a slow driver physical profile 436, and the third-stage first medium grouping 442 and/or the third-stage second medium grouping 444 can correspond to a medium driver physical profile 446.

In some embodiments, as an example, each of the driver groupings can include two drivers (e.g., one driver for stage 3A and one driver for stage 3B). The relative driver sizes of the example circuit may be as described in Table 1 below.

TABLE 1

|  | Stage 3A | Stage 3B |
|---|---|---|
| Fast Driver Size | $1Z_A$ or $2Z_A$ | $1Z_B$ or $2Z_B$ |
| Medium Driver Size | $(\frac{1}{2})Z_A$ | $(\frac{1}{2})Z_B$ |
| Slower Driver Size | $(\frac{1}{2})Z_A$ | $(\frac{1}{2})Z_B$ |

Further, of the example circuit may be as described in Table 2 below.

TABLE 2

|  | Stage 3A | Stage 3B |
|---|---|---|
| Fast Capacitance Value | $0.5C_{3A}$ or $1C_{3A}$ | $1C_3$ or $2C_{3B}$ |
| Medium Capacitance Value | $1C_{3A}$ | $2C_{3B}$ |
| Slower Capacitance Value | $1.5C_{3A}$ | $2C_{3B}$ |

Specifically for the seven output legs, with each the driver groupings including two drivers (e.g., one driver for stage 3A and one driver for stage 3B), the relative driver sizes of the example circuit may be as described in Table 3 below.

TABLE 3

|  | Stage 3A | Stage 3B |
|---|---|---|
| Single Base Grouping | $1Z_A$ | $1Z_B$ |
| Fast Groupings | $2Z_A$ | $1.5Z_B$ |
| Medium Groupings | $1Z_A$ | $1.5Z_B$ |
| Slow Groupings | $1.5Z_A$ | $1.5Z_B$ |

Further, of the example circuit may be as described in Table 4 below.

TABLE 4

|  | Stage 3A | Stage 3B |
|---|---|---|
| Single Base Grouping | $1C_{3A}$ | $1C_{3B}$ |
| Fast Groupings | $2C_{3A}$ | $2C_{3B}$ |
| Medium Groupings | $2C_{3A}$ | $2C_{3B}$ |
| Slow Groupings | $2.5C_{3A}$ | $2C_{3B}$ |

In some embodiments, the minimum capacitance value and/or the minimum driver size within the grouping (e.g., across stage 3A and stage 3B) can be equal (e.g., $Z_A=Z_B$ and/or $C_{3A}=C_{3B}$). In some embodiments, the minimum capacitance value and/or the minimum driver size can be equal to that of the first stage (e.g., X=Z and/or $C_3=C_1$) and/or the second stage (e.g., Y=Z and or $C_3=C_2$).

The electronic device (e.g., the memory device 100 of FIG. 1) can use one or more of the circuit sets (e.g., the faster set, the slower set, the medium set, and/or the extra set) and/or the driver combinations therein to control the slew rates of the output signals. For example, the first stage can select the specific legs/circuit sets (e.g., the number of sets, specific combination of the sets, etc.) in the third stage that is used to generate the output signals. Also, the selected set(s) in the third stage can control specific paths/fingers in the fourth stage for controlling the strength information (e.g., the ODS or ODT) of the generated output signal.

Similar to the second pre-driver 204, the output driver 206 can include a set of multiple (e.g., two, three, four, or more) circuit sets/modules, a set of drivers (e.g., 2 or more, such as a seven-driver implementation illustrated in FIG. 4), etc. The fourth stage circuit sets/drivers can correspond to the phase/slew rate groupings/configurations of the third stage. For example, the fourth stage circuit 218 can include the three or four circuits sets for implementing three phases (e.g., three different slew rates that correspond to faster, slower, and medium rate). Further, the second pre-driver 204 can include multiple circuit sets configured for different slew rates or speeds (e.g., a fourth-stage first set 451, a fourth-stage fast set 452, a fourth-stage slow set 453, a fourth-stage medium set 454, etc.).

The circuit sets of the fourth stage can receive outputs (e.g. Pre0-Pre6) of corresponding circuit sets from the third stage. For example, the fourth-stage first set 451 can receive the output (e.g., Pre0) of the third-stage first set 401. Similarly, the fourth-stage fast set 452 can receive (e.g., Pre1 and/or Pre2) from the third-stage fast set 402, the fourth-stage slow set 453 from the third-stage slow set 403 (e.g., Pre3 and/or Pre4), the fourth-stage medium set 454 from the third-stage medium set 404 (e.g., Pre5 and/or Pre6), etc. In some embodiments, each leg can have a resistance of 240 ohms. The total resistance of the fourth stage can correspond to a ratio between the resistance of each leg and the number of activated legs. For example, since the circuit legs are in parallel, 40 ohms can require six legs resulting from the two fast, two slow, and two medium circuit legs. Also, 60 ohms can require two fast and two medium circuit legs.

Each set of drivers (e.g., each leg) can include a set of internal drivers and/or circuit paths configured to provide variable amount of drive strength for the output signal. For example, each leg can include a set of parallel circuit paths, with each circuit path including one or more gates that control a voltage/current contribution in generating the output signal. Also, each of the gates can be configured to have a physical characteristic (e.g., a size, a gate loading, a capacitance value, etc.) that is designed contribute a specific amount of delay in the resulting slew rate of the generated signal.

As discussed above, the first pre-driver 202 can process signals that correspond to all circuit legs and, in some embodiments, control/activate signal routes (e.g., particular legs). The driver groupings in the second pre-driver 204 and the output driver 206 can correspond to the different slew rates. Faster grouping of output legs in the second pre-driver 204 can be used to define/control a turn-on timing of the output driver. Medium grouping of the output legs can be used to smooth out or shape the data transition. Slower grouping of output legs can be used to keep the correct strength once the data signal is communicated between devices.

Figure 5:
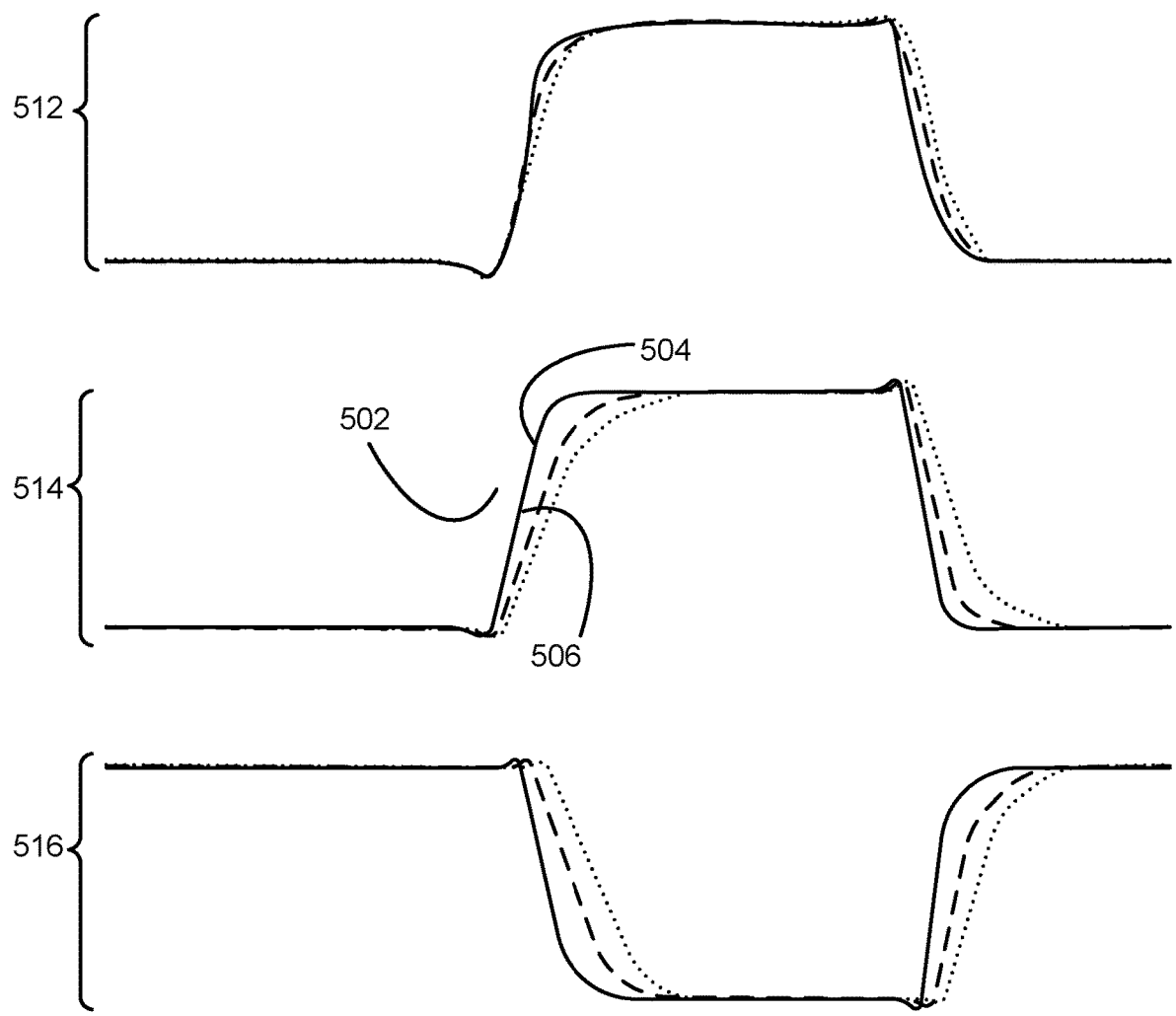
FIG. 5 illustrates an example output signal set in accordance with an embodiment of the present technology.

FIG. 5 illustrates an example output signal set in accordance with an embodiment of the present technology. The output signal set can illustrate slew rates in signals after different stages in the electronic device (e.g., the memory device 100 of FIG. 1, such as a DDR4 DRAM device). For example, FIG. 5 can illustrate slewed signals (e.g., a first slewed signal 504 represented by a dashed line and a second slewed signal 506 represented by a dotted line) in relation to a base or input signal 502 (e.g., signal represented by a solid line) at three different points in the signal output circuit 200 of FIG. 2.

An initial output set 512 can illustrate the signals after the first pre-driver 202 of FIG. 2. A pre-driven set 514 can illustrate the signals after the second pre-driver 204 of FIG. 2. An output set can illustrate the signals generated after the output driver 206 of FIG. 2. As shown, the first pre-driver 202 can cause a relatively small phase shift or delay for the first slewed signal 504 and the second slewed signal 506. The second pre-driver 204 and/or the output driver 206 can cause a larger phase shift or delay.

Figure 6:
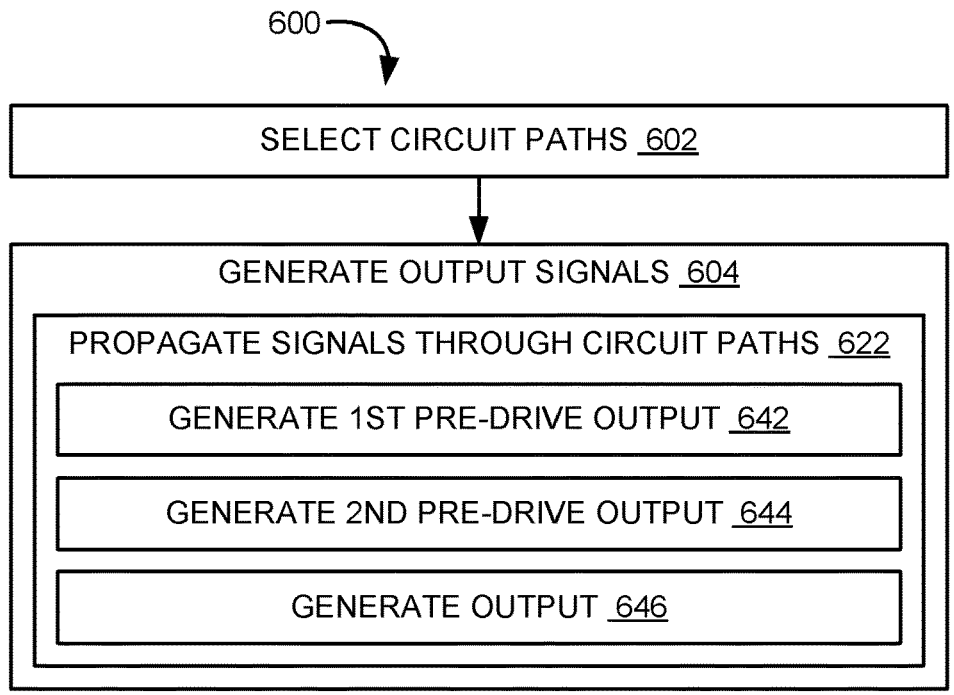
FIG. 6 illustrates a flow diagram illustrating an example method of operating an electronic device in accordance with an embodiment of the present technology.

FIG. 6 illustrates a flow diagram illustrating an example method 600 of operating an electronic device (e.g., the memory device 100 of FIG. 1 or the signal output circuit 200 of FIG. 2 therein) in accordance with an embodiment of the present technology. The example method 600 can correspond to the signal diagram illustrated in FIG. 5. The example method 600 can be for introducing different slew rates based on selecting and/or routing specific circuit paths, and relying on the physical characteristic of the circuit paths to introduce/cause the delay/phase shifts for the slew rates.

At box 602, the memory device 100 can select circuit paths for generating output signals. The memory device 100 can select the circuit paths for generating output signals corresponding to different slew rates. For example, the memory device 100 can select different circuit groupings (e.g., fast, slow, medium, etc.) for generating a 3-phase output signal. The memory device 100 can select corresponding combination of drivers (e.g., a first combination of fast-speed set of drivers, a second combination of slow-speed set of drivers, a third combination for a medium-speed set of drivers, etc.) across the first pre-driver 202 of FIG. 2, the second pre-driver 204 of FIG. 2, the output driver 206 of FIG. 2, etc.

At box 604, the memory device 100 can generate output signals (e.g., outputs from the signal output circuit 200) using the selected circuits. For example, the memory device can generate the first output signal (e.g., corresponding to a first slew rate) using the first circuit grouping, the second output signal (e.g., corresponding to a second slew rate) using the second circuit grouping, the third output signal (e.g., corresponding to a third slew rate) using the third circuit grouping, etc.

At box 622, the memory device 100 can generate output signals based on propagating the input signals (e.g., In<0-2>) through the selected/established circuit groupings (e.g., fast grouping, slow grouping, medium grouping, etc.). For example, at block 642, the memory device 100 can generate the first pre-driver outputs using the first pre-driver 202 (e.g., the first stage circuit 212 of FIG. 2 and/or the second stage circuit 214 of FIG. 2). The In<0-2> input signals can propagate through the driver groupings (e.g., the first driver 302 of FIG. 3, the second driver 304 of FIG. 3, the third driver 306 of FIG. 3, the fourth driver 308 of FIG. 3, etc.) in the first stage 212 to generate the Dat<0-3> internal signals. Subsequently, the Dat<0-3> internal signals can propagate through the driver groupings (e.g., the first driver 352 of FIG. 3, the second driver 354 of FIG. 3, the third driver 356 of FIG. 3, the fourth driver 358 of FIG. 3, etc.) to generate the Drv<0-3> internal signals. In some embodiments, the input signals, the internal signals, the corresponding enable signals, the corresponding driver groups, etc. can correspond to different slew rate or delay speeds (e.g., fast, medium, slow slew rates). As such, the memory device 100 can use the first pre-driver 202 to select the circuit path (e.g., the circuit legs or the drivers in stage 3 and/or stage 4) and initially drive the signals.

Also, at block 644, the memory device 100 can generate the second pre-driver outputs using the second pre-driver 204 (e.g., the third stage circuit 216 of FIG. 2). The Drv<0-3> internal signals can propagate through the driver groupings (e.g., the seven drivers/circuit legs grouped into three or more sets) in the third stage 216 to generate the Pre<0-6> internal signals. The generated internal signals can correspond to different slew rates that is associated with the physical characteristics (e.g., the driver size, the gate loading, the capacitance level, etc.) of the generating circuit.

At block 646, the memory device 100 can generate the outputs of the signal output circuit 200 using the output driver 206 (e.g., the fourth stage circuit 218 of FIG. 2). The Pre<0-6> internal signals can propagate through the driver groupings (e.g., the seven drivers/circuit legs grouped into three or more sets) and the internal circuit paths in the fourth stage circuit 218. The generated output signals can correspond to the different slew rates that correspond to the physical characteristics of the driver circuit and the drive strength that correspond to the internal circuit paths. For example, one of the output signals can be generated using the fast drivers, and as a result, have a fast slew rate associated with the physical characteristics of the fast drivers. Similarly, the slow drivers can generate slower output signals and the medium drivers can generate output signals with slew rates in between the faster signal and the slower signal, all based on the physical characteristics of the generating drivers. In some embodiments, other than the different physical characteristics, the different circuit paths/ drivers can include same type of circuit components and same sequence/connections.

The use of circuit physical characteristics to generate the different slew rates provides improved performance and reduced power consumption since the configuration splits/ routes the signals rather than repeating them throughout the circuit. Also, for DDR4 implementations, the relaxed timing restrictions (e.g., in comparison to DDR3) can allow for a wider window in controlling the slew rates. As such, controlling/implementing the slew rate can be done using the physical characteristics and without any specific circuits/ control components. As such, the overall complexity and the total number of required components for the signal generator circuit can be reduced, thereby increasing the manufacturability and/or the circuit footprint.

Further, the use of circuit physical characteristics can reduce or even eliminate the need for any stagger delays in generating the different slew rates. As such, using the physical characteristics to generate the phases can provide improved efficiency and reduced the circuit footprint/size based on eliminating/reducing the stagger delays. Moreover, the reduction/elimination of the stagger delays can provide improvements in speed timings, such as by shortening access times. The reduction in the number and/or size devices can lead to the reduction in power consumption, which can further lead to improvement in reliability and lifetime of the electronic device. The use of circuit physical characteristics can also reduce the dependency/correlation to the PVT variations, which can improve high speed or high frequency operations of the electronic device.

Also, the use of circuit physical characteristics can be leveraged simplify the control and data, and eliminate or reduce test modes in the path. This can remove complexities in stack devices, such as for test mode signal on top of data used to adjust the propagation delay, and further reduce gate capacitive loading over all fourth paths (e.g., the single driver grouping path, the two fast driver groupings, the two middle driver groupings, the two slower driver groupings) of four stages of pull-up/pull-down devices, such as for a total of 32 gate reduction for each data (DQ).

Figure 7:
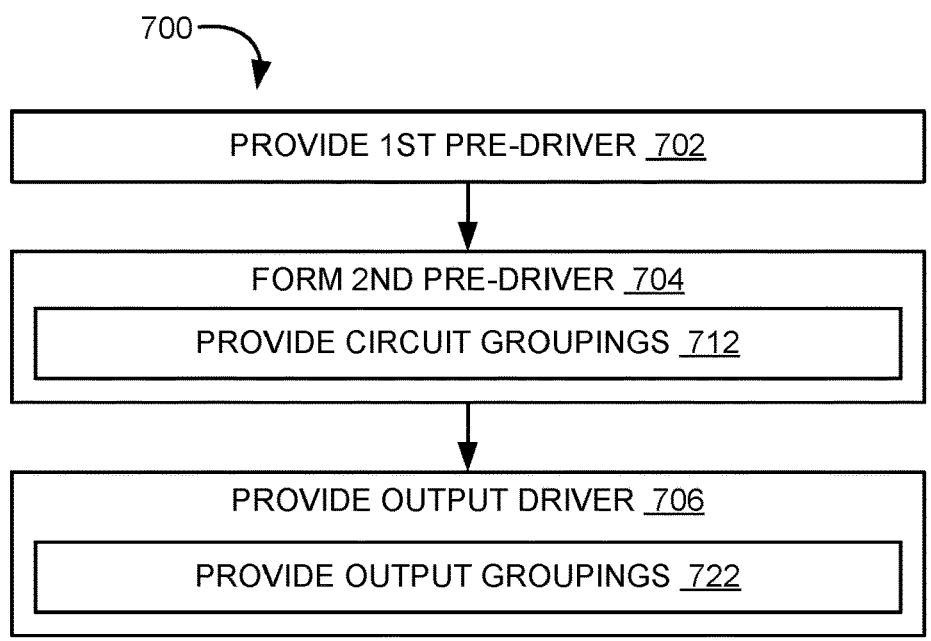
FIG. 7 illustrates a flow diagram illustrating an example method of manufacturing an electronic device in accordance with an embodiment of the present technology.

FIG. 7 illustrates a flow diagram illustrating an example method 700 of manufacturing an electronic device (e.g., the memory device 100 of FIG. 1 or the signal output circuit 200 of FIG. 2 therein) in accordance with an embodiment of the present technology. The example method 700 can be for configuring circuits with selectable routes, different physical characteristics, etc., such that natural propagation of signals through specific paths can introduced designated slew rates.

At block 702, the method 700 can include providing the first pre-driver 202 of FIG. 2 configured to generate a set of data signals (e.g., Drv<0-3>) for initially driving the output signals. Providing the first pre-driver 202 can include providing the drivers configured to process the input signals (e.g., In<0-2>) for different circuit/driver groupings (e.g., the faster set, the medium/in between set, the slower set, etc.). For example, providing the first pre-driver 202 can include providing the first driver 302, the second driver 304, the third driver 306, the fourth driver 308, etc. of FIG. 3 for the first stage 212 of FIG. 2; the first driver 352, the second driver 354, the third driver 356, the fourth driver 358, etc. of FIG. 3 for the second stage 214 of FIG. 2; etc.

At block 704, the method 700 can include providing the second pre-driver 204 of FIG. 2 configured to route the set of data signals (e.g., outputs of the first pre-driver 202) through a set of circuit legs (e.g., driver sets) for controlling the slew rates of the signals. For example, providing the second pre-driver 204 can include providing at least two sets of drivers or circuit groupings, such as at block 712. The different driver sets/circuit groupings can have components with different physical characteristics that produce different slew rates in the generated signals. In some embodiments, the sets/groupings can include a faster set of drivers for faster slew rate, a slower set of drivers for slower slew rate, a medium set of drivers for slew rates between the faster and slower rates, etc.

At block 706, the method 700 can include providing the output driver 206 of FIG. 2 configured to generate the output signals according to the set of circuit legs/driver sets. For example, providing the output driver 206 can include providing at least two sets of drivers/output legs that each correspond to a driver/circuit set of the second pre-driver 204, such as at block 722. Further, each of the drivers/output legs in the output driver 206 can include a set of signal paths configured to provide a drive magnitude in the output signals. The output driver 206 can engage the output leg and the signal paths according to the preceding circuits (e.g., the first pre-driver 202 and/or the second pre-driver 204) and/or control/enable signals.

The provided drivers, such as for the first pre-driver 202, the second pre-driver 204, the output driver 206, etc., can be grouped into two or more groups. The groupings can be based on circuit/component physical characteristics and the corresponding slew rates. For example, the drivers/circuits in the first pre-driver 202, the second pre-driver 204, the output driver 206, etc. can be grouped to generate a first/ faster output that corresponds to a faster slew rate, a second/ slower output that corresponds to a slower slew rate, a third/medium output that corresponds to a medium slew rate that is between the faster and the slower slew rates. In some embodiments, the circuit/driver groupings can include same component types, same connections/sequence, etc. The different groupings can differentiate from each other based on the different physical characteristics of the circuit/components.

In some embodiments, providing the driver/circuit, such as for blocks 702-706, can include attaching the circuit components to a substrate, a base, a frame, a preceding circuit (e.g., DLL), etc. In some embodiments, providing the driver/circuit can include forming the corresponding driver/ circuit/component. For example, providing the driver/circuit can include semiconductor or wafer-level processes (e.g., depositing, etching, planarization, doping, etc.) used to form the circuits/semiconductor devices.

Figure 8:
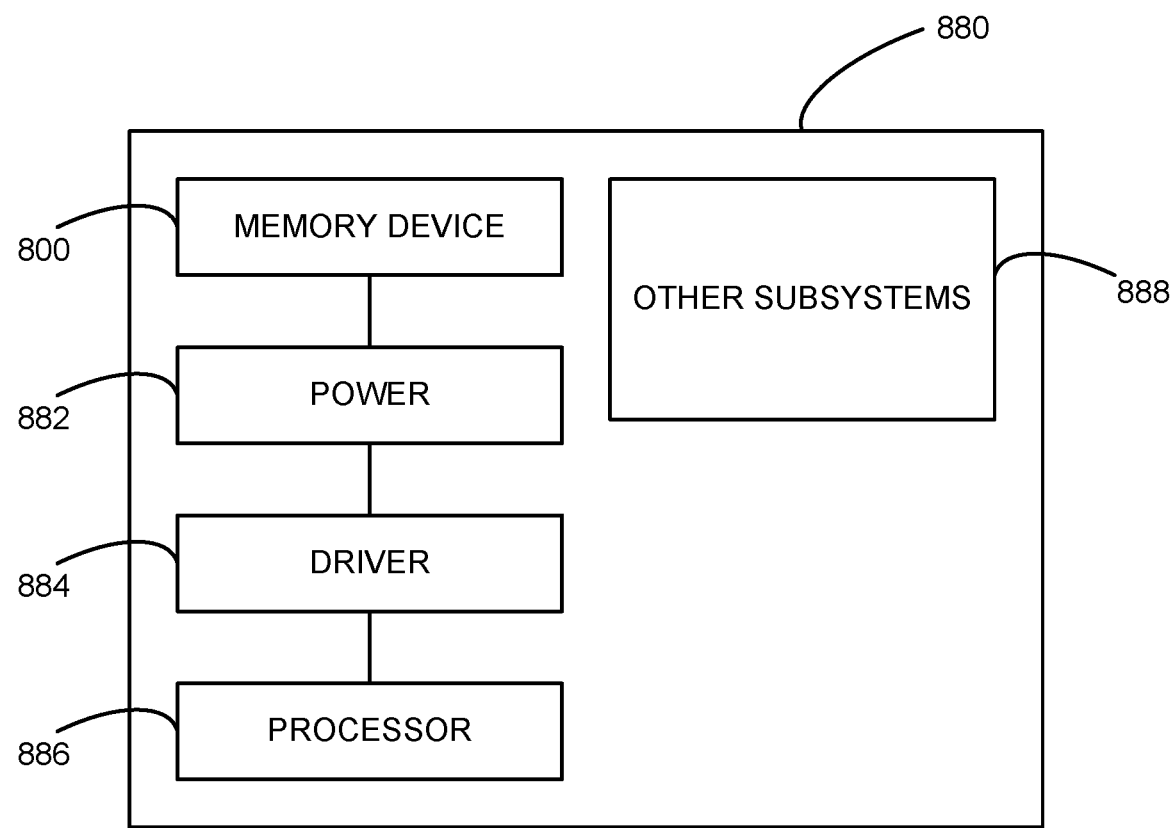
FIG. 8 is a schematic view of a system that includes an electronic device in accordance with an embodiment of the present technology.

FIG. 8 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the memory device described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of devices incorporating DDR based DRAM. Memory devices configured in accordance with other embodiments of the present technology, however, can include other types of suitable storage media in addition to or in lieu of DDR DRAMs, such as NAND or NOR-based storage media, non-volatile storage media, magnetic storage media, phase-change storage media, ferroelectric storage media, etc. Further, the various embodiments have been discussed in reference to the output signals. However, it is understood that the various embodiments can be implemented in other ways where delays are relatively small, such as circuits where multiple paths need to track closely to each other, DLL multiple controls for read/ODT clocks, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-7.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. An electronic device, comprising:
    a first circuit grouping including a first set of drivers, the first circuit grouping configured to generate a first output signal corresponding to a first slew rate; and
    a second circuit grouping parallel to the first circuit grouping, the second circuit grouping including a second set of drivers, the second circuit grouping configured to generate a second output signal corresponding to a second slew rate; and
    a first pre-driver circuit coupled to the first circuit grouping and the second circuit grouping, the first pre-driver circuit configured to activate one or more drivers from the first circuit grouping, the second circuit grouping, or a combination thereof to generate a set of output signals having at least the first slew rate and the second slew rate,
    wherein:
        the first set of drivers are configured with one or more physical characteristics different than those of the second set of drivers corresponding to a difference between the first and second slew rates.

2. The electronic device of claim 1, wherein the one or more physical characteristics include a driver size, a gate size, a gate loading amount, a capacitance value, or a combination thereof of drivers in the first and second sets of drivers.

3. The electronic device of claim 1, further comprising:
    a third circuit grouping including a third set of drivers, the third circuit grouping configured to generate a third output signal corresponding to a third slew rate, wherein the third slew rate is between the first slew rate and the second slew rate,
    wherein:
        the first circuit grouping, the second circuit grouping, and the third circuit grouping are configured to generate output signals corresponding to three different phases corresponding to the different slew rates.

4. The electronic device of claim 3, wherein the first circuit grouping, the second circuit grouping, and the third circuit grouping each include:
    the first pre-driver circuit configured to generate a set of data signals for initially driving the output signals;
    a second pre-driver circuit coupled to the first pre-driver circuit, the second pre-driver circuit configured to route the set of data signals through a set of circuit legs for controlling the slew rates; and
    an output driver circuit coupled to the second pre-driver circuit, the output driver configured to generate the output signals according to the set of circuit legs.

5. The electronic device of claim 4, wherein:
    the second pre-driver circuit includes a set of drivers corresponding to the first slew rate, the second slew rate, and the third slew rate; and
    the first pre-driver circuit configured to control on/off state of one or more drivers in the set of drivers, wherein the first pre-driver circuit controls the on/off state to enable the set of circuit legs.

6. The electronic device of claim 5, wherein the first pre-driver circuit includes at least four drivers, wherein the at least four drivers receive and drive three input signals to generate four output data signals.

7. The electronic device of claim 6, wherein the first pre-driver circuit includes a first driver, a second driver, a third driver, and a fourth driver parallel to each other, wherein the first driver and the second driver are configured to receive a first input signal, the third driver receives a second input signal, and the fourth driver receives a third input signal.

8. The electronic device of claim 6, wherein two or more of the output data signals correspond to each other.

9. The electronic device of claim 4, wherein:
the output driver circuit includes a set of circuit paths corresponding to each circuit leg, the set of circuit paths configured to control a drive magnitude, a slew rate, or a combination thereof in the output signals;
the second pre-driver configured to control an on/off state of each circuit path for setting the drive magnitude, the slew rate, or the combination thereof.

10. The electronic device of claim 9, wherein the second pre-driver and the output driver corresponds to at least six circuit legs, wherein two of the circuit legs are associated with the first slew rate, two other circuit legs are associated with the second slew rate, and two other circuit legs are associated with the third slew rate.

11. The electronic device of claim 5, wherein:
the first pre-driver circuit introduces a first adjustment amount to a resulting slew rate; and
the second pre-driver circuit and/or the output driver circuit introduces a second adjustment amount to the resulting slew rate, wherein the second adjustment amount is greater than the first adjustment amount.

12. The electronic device of claim 1, wherein the electronic device comprises a memory device.

13. The electronic device of claim 12, wherein the memory device is configured to implement a double data rate-4 (DDR4) interfacing scheme.

14. A method of manufacturing an electronic device, the method comprising:
forming a first circuit grouping configured to generate a first output corresponding to a first slew rate,
the first circuit grouping including a first set of drivers that correspond to a first set of physical characteristics contributing to the first slew rate; and
forming a second circuit grouping configured to generate a second output corresponding to a second slew rate,
the second circuit grouping including a second set of drivers that correspond to a second set of physical characteristics contributing to the second slew rate,
wherein the second circuit grouping includes a combination of types of electronic components same as the first circuit grouping, and
wherein the second set of drivers is configured with one or more physical characteristics different than those of the first set of drivers corresponding to a difference between the first and second slew rates.

15. The method of claim 14, wherein the first and second sets of physical characteristics include driver/gate sizes, gate loading amounts, capacitance values, or a combination thereof of drivers in the first and second sets of drivers.

16. The method of claim 14, further comprising:
forming a third circuit grouping configured to generate a second output corresponding to a third slew rate,
the third circuit grouping including a third set of drivers that correspond to a third set of physical characteristics contributing to a third slew rate, wherein the third slew rate is between the first slew rate and the second slew rate,
wherein:
forming the first circuit grouping, the second circuit grouping, and the third circuit grouping forming circuits for generating output signals having three different phases corresponding to the different slew rates.

17. The method of claim 16, wherein forming the first circuit grouping, the second circuit grouping, and the third circuit grouping includes:
forming a first pre-driver circuit configured to generate a set of data signals for initially driving the output signals;
forming a second pre-driver circuit coupled to the first pre-driver circuit, the second pre-driver circuit configured to route the set of data signals through a set of circuit legs for controlling the slew rates; and
forming an output driver circuit coupled to the second pre-driver circuit, the output driver configured to generate the output signals according to the set of circuit legs.

18. The method of claim 17, wherein:
forming the first pre-driver circuit includes providing at least four drivers configured to process signals for the first, second, and third circuit groupings;
forming the second pre-driver circuit includes providing at least three sets of drivers,
wherein:
a first set of drivers are configured to process signals for the first circuit groupings,
a second set of drivers are configured to process signals for the second circuit groupings, and
a third set of drivers are configured to process signals for the third circuit groupings; and
forming the output driver circuit includes providing at least three sets of drivers corresponding to the driver sets of the second pre-driver circuit, wherein each set of the drivers in the output driver circuit includes a set of signal paths configured to provide a drive magnitude in the output signals.

19. A method of operating an electronic device, the method comprising:
generating a first output signal using a first circuit grouping, wherein the first output signal corresponds to a first slew rate that is associated with a first physical characteristic of the first circuit grouping;
generating a second output signal using a second circuit grouping, wherein the second output signal corresponds to a second slew rate that is associated with a second physical characteristic of the second circuit grouping; and
wherein:
the first circuit grouping and the second circuit grouping both includes same combination of types of electronic components,
the first and second physical characteristics are different and correspond to a difference between the first and second slew rates, and
the first and second physical characteristics include driver/gate sizes, gate loading amounts, capacitance values, or a combination thereof.

20. The method of claim 19, further comprising:
selecting a first combination of drivers to establish the first circuit grouping;
selecting a second combination of drivers to establish the second circuit grouping;
wherein:
generating the first output signal includes propagating a first input through the established first circuit grouping; and
generating the second output signal includes propagating a second input through the established second circuit grouping.

* * * * *